United States Patent Office 3,405,329

Patented Oct. 8, 1968

3,405,329

SEMICONDUCTOR DEVICES

Alberto Loro and Stanley D. Rosenbaum, Ottawa, Ontario, Canada, assignors to Northern Electric Company Limited, Montreal, Quebec, Canada Filed Aug. 10, 1964, Ser. No. 388,455
Claims priority, application Canada, June 12, 1964, 904,967
11 Claims. (Cl. 317—234)

ABSTRACT OF THE DISCLOSURE

A semiconductor device having a P-N junction, e.g. a diode or a transistor, is provided with an electrically conducting shield superposed on the oxide layer and electrically connected to one of the regions (P or N).

In a first form (FIGURE 1), the shield overlies the junction edge in a diode. In other forms (FIGURE 5 or 6), it overlies one or both junctions of a transistor. In another form (FIGURE 7 or 8), a shield overlies a portion of the region surrounding the junction.

In variants of the first form (FIGURES 12 to 20) the shield terminates in an "upturned collar" diverging from the surface of the device to produce a gradually tapering electrostatic field.

The shields, and particularly the latter variants (FIGURES 12 to 20) afford improved breakdown voltages. In a transistor, a shield over the emitter base junction improves gain stability, while a guard shield (FIGURE 7 or 8) prevents channelling from the P-N junction to a side surface of the device.

This invention relates to improvements in semiconductor devices and is more specifically directed towards improving the performance and reliability of such devices.

The various aspects of the present invention are applicable to any device having a P-N junction, including simple diodes, conventional three element transistors, and the more complex multi-element transistor devices.

As will appear more fully from the specific description below, the invention (more especially in one of its aspects) is particularly suited to the improvement of the characteristics of semiconductor devices incorporating a planar junction. Although the term "planar transistor" is now commonly used, it is considered desirable in the interests of clarity to define the meaning which it is intended should apply in this document to the term "planar junction." By a planar junction we mean a junction in which that portion of the semiconductor surface intersected by the junction lies in a single plane. This is the type of junction found in the type of transistor or diode commonly referred to as planar, but includes alloy junctions and epitaxial junctions, while being in contradistinction to the mesa type junction in which the portion of the semiconductor surface intersected by the junction lies in a cylindrical or conical surface.

While the invention has been developed primarily to provide improvements in devices incorporating at least one junction which is planar, it is also applicable to a mesa type junction.

In one of its aspects the invention is concerned with improving the breakdown voltage of a P-N junction. Under reverse bias conditions, a P-N junction passes negligible current, until the voltage across the junction has been raised to a certain value (called the breakdown voltage) whereupon a large current suddenly flows. Efforts to raise the value of the breakdown voltage of semiconductor devices have figured prominently in research programs during recent years, but no great success has yet been achieved. The problem is especially pertinent in the design of semiconductor devices with planar junctions, where the problem becomes not only one of achieving the highest possible breakdown voltage (without sacrifice of other desirable characteristics), but also one of constructing a device in which the breakdown voltage is stable and constant. Planar junctions tend to exhibit the phenomenon known as "walk-out," which is a tendency for the breakdown voltage to increase as the device is heated by the passage of current. Planar junctions are also prone to variation of breakdown voltage with age and as a result of varying environmental conditions.

To minimize these undesirable characteristics by increasing and stabilizing the value of the breakdown voltage of P-N junctions is one of the objects of the present invention.

Although the problem exists in some measure in almost all semiconductor devices—and the solution provided by this invention is equally universally applicable—it will be convenient to illustrate the invention by specific discussion of one form of device in which the problem is especially acute. Such a device is a planar semiconductor junction in which the less heavily doped material is of N type material, for example a diode in which a P type diffused region has been formed in a background of N type material. In such a construction the P region will necessarily be more heavily doped than the N region. Indeed in all P-N junctions one region is always more heavily doped than the other.

Under reverse bias conditions, that is with the P region negative with respect to the N region, a so-called depletion layer is formed over the entire surface of the junction between the P and N regions. The depletion layer is an area on each side of the junction which has been depleted of mobile charge carriers (electrons and holes). The fixed charges that remain, positive in the N region and negative in the P region, define an electric field across the junction, the intensity of which field increases with the applied voltage. The value of this field will be sufficient to cause breakdown and current flow, and consequently the breakdown voltage can be calculated from the properties of the materials. However, it is found in actual devices that the observed breakdown voltage is usually significantly below that which would be expected by calculation.

It has now been discovered that the actual value of the breakdown voltage can be substantially improved by the provision of a shield electrically connected to the P region and overlying the entire line of intersection of the junction with the free surface of the device and extending for at least a short distance beyond this line over the N region. In accordance with conventional practice the free surface of the device will be covered by a thin layer of oxide or other insulating material, and the shield will be located above this layer so as to be electrically insulated from the N region.

While it is desired to remain uncommitted regarding any detailed theory of the exact mechanism by which this shield increases and stabilizes the breakdown voltage—especially since the improvements obtainable have been demonstrtaed experimentally—it is thought that the improvements are the result of a change of shape of the edge of the junction depletion layer, brought about by the charge on the shield. It is postulated that, while the depletion layer is of substantially uniform thickness over the area of the P-N junction within the device (that is, inwardly of the edge) it is of reduced thickness along such edge, namely at the line where the junction meets a free surface of the device. In referring to a free surface, the presence of the thin superposed, insulating layer is ignored.

This narrowing of the depletion layer along the junction edge is believed to be the result of extraneous electrostatic charges associated with the insulating layer itself.

Such charges tend to appear on the outer surface of the insulating layer as a result of the general electrical and atmospheric environment of the device, and they are difficult to avoid or dispel. They may also take the form of molecular charges within the insulating material itself. Such charges usually tend to be positive and thus to build up an accumulation layer near the surface of N type material, or a depletion or inversion layer near the surface of P type material. Accumulation and depletion layers (also referred to as "channels") are surface regions in which either an excess (accumulation) or a scarcity (depletion) of mobile carriers is set up. An inversion layer is a layer that has been so heavily depleted that its polarity becomes reversed. Positive exterior charges will induce an accumulation layer (an excess of electrons) in N type material and this effect will be more marked the more lightly doped the material.

For general design reasons, it is often desirable to employ a background of lightly doped N type material. It is believed that in such circumstances a significant accumulation layer beneath the oxide insulation is virtually always present. Such a layer may even be formed during manufacture and remain trapped in the device, regardless of how much care is taken later to exert tight control over external influences and environmental conditions.

Where such a surface accumulation channel meets the depletion layer of the junction, the effect is equivalent to a bending of the junction depletion layer inwardly towards the junction edge, or, in other words, a narrowing of the junction depletion layer in the vicinity of its edge, which could be thought of as the formation of a "thin spot" in the depletion layer. By placing a conducting shield to lie directly over this edge and to extend beyond such edge to overlie the less doped region (N-type material in the example) by a distance at least equal to the width of the part of the junction depletion layer that lies in the N region, and by permanently connecting such shield to the P region (which is of negative polarity, under reverse bias conditions), the formation of an accumulation layer is positively prevented, or, if one is initially present, it is neutralized, at least in the close vicinity of the shield. The effect is for the channel to change from an accumulation to a depletion layer, which latter then merges into the junction depletion layer. This action is equivalent to causing the junction depletion layer to bulge rather than to narrow at the junction edge.

It has been shown experimentally that, provided the shield overlies the entire length of the junction edge, the breakdown voltage is increased and moreover assumes a more stable value. In diodes designed for relatively low voltage operation, the breakdown voltage obtained when a shield was added approximated to the theoretical value as calculated for the junction. It seems probable that the breakdown now no longer occurs across the "thin spot" at the edge of the junction, since the "thin spot" has been eliminated. If only a small portion of the edge is left unshielded, the device will revert to its former breakdown voltage, the breakdown presumably always occurring at the unshielded portion of the edge.

This "edge," or "line of intersection" with a free surface, as it has been called, can be conveniently thought of as annular. In many planar devices it will in fact comprise a true circle. The important point is that it will always be closed on itself. In some transistors the junction edges follow complex saw-tooth or starlike patterns, and moreover the entire edge need not necessarily lie in a single plane. To achieve the above-noted improvement in breakdown voltage characteristics, it is essential that the full length of this edge, however it may wander, should be shielded; otherwise there will be a "thin spot" somewhere that will undo any good done at the areas that are shielded.

While the axample chosen above was that of an N type, lightly doped material, into which a more heavily doped P type material had been diffused, the invention is equally applicable to a P type background material into which a more heavily doped N type material had been diffused. No problem as far as breakdown voltage is concerned will normally arise in such a device, if the external surface charges remain positive, because the surface channel will tend to be a depletion layer rather than an accumulation layer and it will tend to merge with the junction depletion layer. It is necessary, however, to provide against the possibility that negative external surface charges may be induced by outside sources, in which circumstances the shield will be just as necessary and just as useful as in the example of an N type base material that has already been discussed.

In diodes designed for high voltage operation, that is those employing a comparatively high resistivity background material (for examples, a resistivity of 20 to 60 ohm cm.), the improvement obtainable by the use of a shield was found to be less pronounced (although still present), and still short of the theoretical junction breakdown voltage which can be calculated from the known properties of the materials employed.

It has now been discovered that the performance of such a shield can be substantially improved by the further provision of conducting means connected to be of the same electrical polarity as the shield, such conducting means extending beyond the shield over the less heavily doped region for forming a fringe electrostatic field extending from the conducting means to the less heavily doped region along the entire extent of the shield, said field being of gradually tapering intensity in the direction away from the shield.

It is believed that the improved breakdown voltage observed when this conducting means is employed to generate a fringe field, is due to the gradually tapering nature of such field and the consequent absence of any area of sharp change of electrical potential or area of electrical stress at which breakdown can be initiated. The mechanism of the improvement afforded by this aspect of the present invention is not fully theoretically understood, but practical experimentation indicates dramatically that the provision of a gradually diminishing fringe field substantially enhances the breakdown voltage of devices so modified.

While the improvement afforded by this latter feature of the invention has been found to be especially valuable in relation to so-called high voltage diodes, it also provides less spectacular but nevertheless useful improvement in the breakdown voltage characteristics of other semiconductor devices, such as low voltage diodes and transistors.

In a further aspect the invention is concerned with a generally similar type of shield employed in a transistor to stabilize the gain thereof. This gain stabilizing shield also functions to prevent the build up of or to neutralize extraneous external charges which are believed to be responsible for fluctuations in gain charactertistics between the base and emitter regions of planar transistors. Again the shield is permanently electrically connected to one of the regions—this time the less heavily doped region, the base region—and extends over the full length of the junction edge. It also extends over the less heavily doped region (base) adjacent such edge. The nature of this gain stabilizing shield is more fully described below.

In another aspect, the invention is concerned with a further form of shielding which is provided to interrupt channelling between the P-N junction and the peripheral side surfaces of the device. Damage to these side surfaces is an inevitable consequence of the standard method of manufacturing of planar devices in which a number of diodes or transistors are made side by side as a block on a substrate, the block then being cut up to form individual devices. Surface channels in the form of inversion layers (areas that have been so depleted of one polarity charge carriers as to assume the opposite polarity), tend to form paths of conduction which, combined with the damaged side surfaces where many electron-hole pairs are formed in the faulty crystal lattice, can constitute high leakage shunts across the P-N junction, and thus seriously impair the performance of the device. It is therefore desirable to interrupt any inversion channels or potential inversion channels before they extend to the side surfaces, so as to render them harmless as leakage paths. The achievement of this purpose in a simple and effective manner is another object of the present invention.

Such object is achieved by surrounding the P-N junction with a shield which overlies an area of the background region outwardly of the junctions, and which is electrically connected to such region. This shield effectively prevents the build up of the external charges that are responsible for inversion channelling.

An arrangement directed towards the same aim of interrupting channelling to the side surfaces is disclosed in Canadian Patent No. 667,423 issued July 23, 1963. This patent teaches the use of a so-called "guard ring" which consists of an annular region in the background material near its periphery. The ring is of the same polarity type as the background material, but more heavily doped. It thus resists polarity inversion to a far higher degree. The "guard shield," as it might be called, with which this aspect of the present invention is concerned, may be used alone to replace the guard ring of said prior patent, or it may be used in combination with such guard ring to provide cumulative protection from channelling.

Some devices constructed in accordance with the various aspects of the present invention are illustrative diagrammatically in the accompanying drawings, such illustration being provided by way of example only and not by way of limitation.

Figure 17:
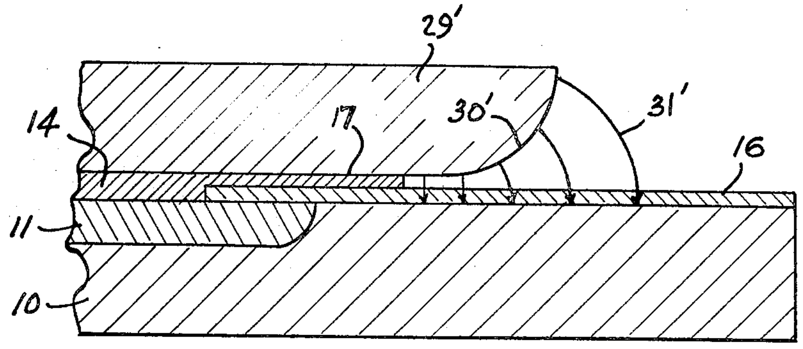
Figure 18:
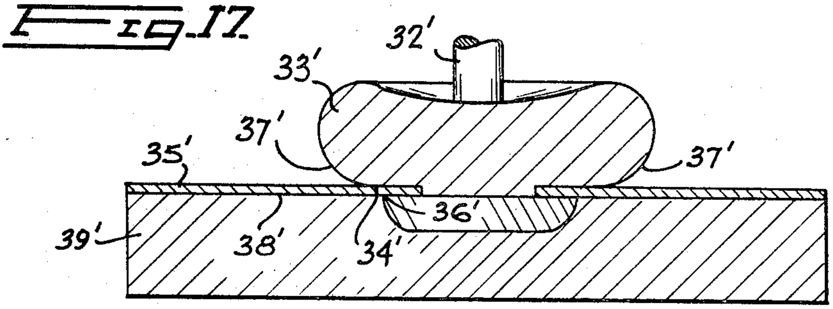
Figure 19:
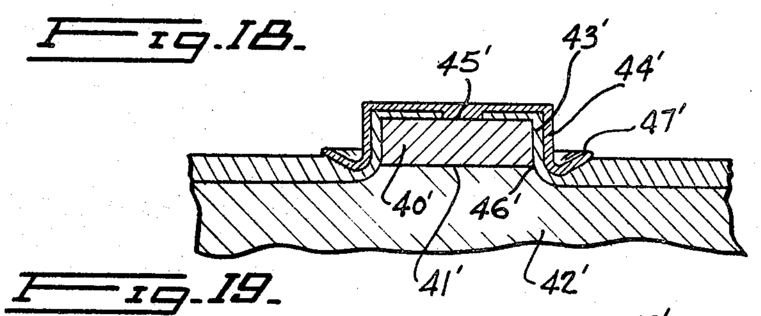
Figure 20:
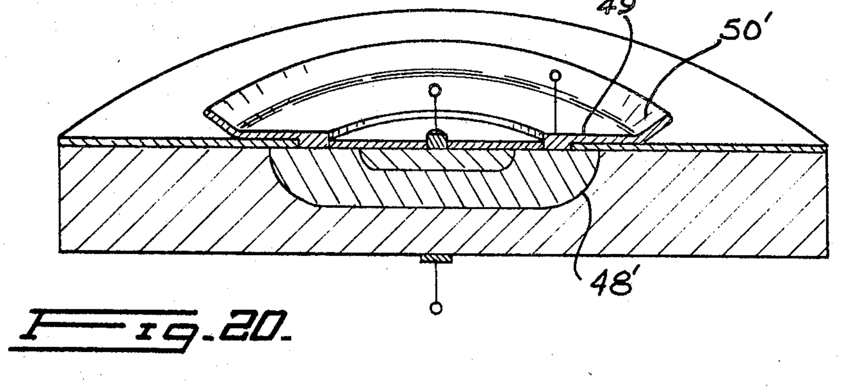

FIGURE 17 similarly shows yet another construction;

FIGURE 18 shows another planar type diode in cross-section, embodying an aspect of the invention;

FIGURE 19 shows a mesa type device in cross-section, also embodying an aspect of the invention; and FIGURE 20 shows an aspect of the invention applied to a planar type transistor.

Figure 1:
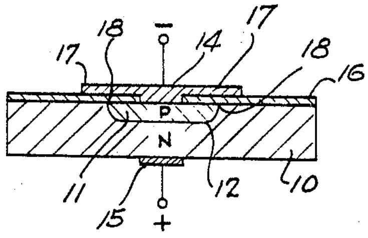
FIGURE 1 is a section through a planar type diode taken on the line 1—1 in FIGURE 2, showing a first form of shield according to the invention.
Figure 2:
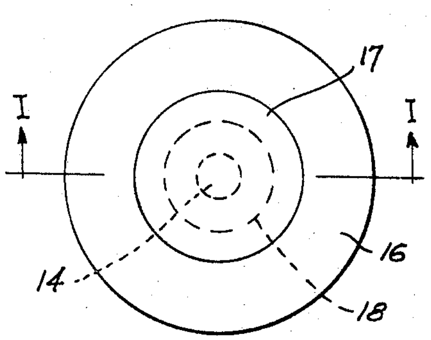
FIGURE 2 is a plan view of FIGURE 1.
Figure 3:
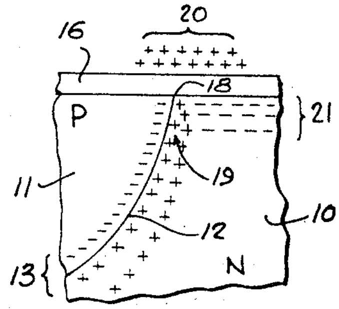
FIG. 3. PRIOR ART
FIGURE 3 is a large scale fragment demonstrating the believed function of a prior art device.
Figure 4:
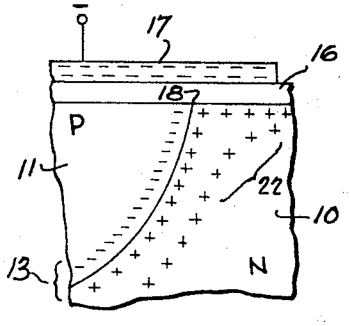
FIGURE 4 is a similar fragment showing the effect of the present invention.

The diode seen in FIGURES 1 and 2 is a diffused diode having a background or undiffused region 10 of one conductivity type, say N type. The diffused region 11 will then be of P type. The device is circular in plan view. The P-N junction shown at 12 is planar. The general area of the depletion layer is shown at 13 (FIGURES 3 and 4). This depletion layer will be relatively thick when the reverse bias voltages shown in FIGURE 1 are applied at terminals 14 and 15. The conventional oxide layer 16 is interrupted for connection of terminal 14 to the diffused region 11, and terminal 14 has been extended as an annular shield 17 to overlie the edge 18 of the P-N junction 12, i.e. the line where this junction intersects the free surface of the device (ignoring the oxide coating 16 which is inert as far as semiconductor function is concerned).

FIGURE 3 shows how, it is believed, typical external positive charges 20 will induce an accumulation layer 21 at the surface of region 10 and how the interaction of this layer 21 with the junction depletion layer 13 is believed to narrow the latter at area 19 in the vicinity of the edge 18 and then set up the thin spot that has caused lowering of the breakdown voltage. The contribution of the part of the depletion layer in the lightly doped region 10 towards the blocking effect of the depletion layer is much greater than the contribution of the part of the depletion layer in the heavily doped region 11. Consequently any narrowing of the part of the depletion layer in the lightly doped region 10 causes a serious deterioration in the maximum voltage that the entire depletion layer can support. FIGURE 4 shows how, it is believed, the presence of the negatively charged shield 17 changes the shape of this edge area of the junction depletion layer 13 by forming a bulge 22 therein instead of the compressed area 19. An accumulation layer (not shown) may form at the surface of the region 10 beyond the outer edge of the shield 17, as a result of positive charges in or on the oxide layer 16, but this cannot upset the conditions that now pertain in the vicinity of the junction edge 18.

Figure 5:
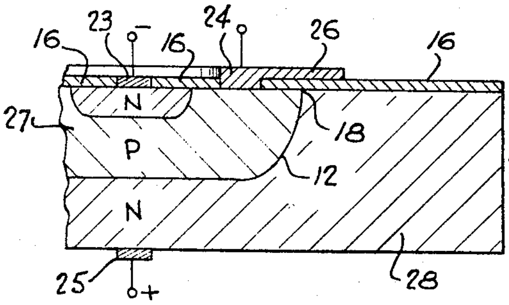
FIGURE 5 is a section through part of a planar type transistor showing the same shielding principle applied thereto.

FIGURE 5 shows the same shielding principle applied to a NPN transistor of planar diffused type having emitter, base and collector electrodes 23, 24 and 25 respectively, with the base electrode 24 continued outwards as an annular shield 26 overlying the edge 18 of the PN junction 12, as before. Whereas, of course, the electrode 24 may be located at any single location around the upper face of the annular base element 27 of the transistor, the shield 26 must be a closed annulus in order to ensure that the full extent of the edge 18 is shielded, for the reasons already discussed.

FIGURES 1 and 5 show the shields 17 and 26 extending radially outwardly beyond the edges 18 to overlap region 10 and collector 28 by generous distances, in order to provide ample shielding effect. It is believed that adequate shielding will normally be obtainable from a more conservative overlap of the regions 10 and 28. Theoretically, the overlap should be not less than the normal maximum width of that part of the junction depletion layer that lies in the region 10 or 28. This maximum width will be the width which the junction depletion layer adopts in the region 10 or 28, at a location inward from a free surface, and for a voltage just below the breakdown voltage, i.e. the maximum voltage before breakdown. In practice rather more overlap than this theoretical minimum will usually be adopted, but the overlap should not be carried so far as to induce an inversion layer which reaches any region of the device that is mechanically damaged (as by cutting) or any other region with which it could establish a leakage path.

It will be observed that in both FIGURES 1 and 5 the shield 17 or 26 is permanently electrically connected to a region of relatively high density doping (region 11 or transistor base 27) while projecting beyond the junction edge 18 to overlie a region of lesser density doping (region 10 or collector 28).

Figure 6:
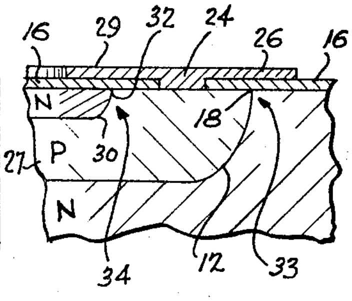
FIGURE 6 shows a modification of the structure of FIGURE 5.

A modification to the FIGURE 5 construction is shown in FIGURE 6 which illustrates a fragment of the same type of transistor, but with which the electrode 24 now also extended to project radially inwardly to form a shield 29 overlying the edge 32 of the junction 30 between the base 27 and the emitter 31. As already explained, it is the area 33 on the less doped side of the edge 18 which is critically affected to improve the breakdown characteristics of junction 12. At junction 30 it is the area 34 in the vicinity of the edge 32, but still on the less doped side, i.e. in the base region 27, that is affected. The effect of shield 29 is not on the breakdown voltage, but on the stability of the gain of the device. It has been found that the gain of this type of transistor may vary from time to time and this phenomenon is thought to be mainly the result of stray charges induced on the outer surface of the insulating layer 16 by external sources, such charges in turn inducing variations in the number of mobile carriers available near the edge 32 of the junction 30, particularly on the more sensitive, less heavily doped side, namely at the area 34 in the region 27. The shield 29 connected permanently to the electrode 24 and hence to the region 27 prevents any significant build up of such charges. The gain stabilizing shield 29 may be usefully adopted in a semiconductor device without the breakdown voltage shield 26 necessarily being simultaneously employed.

Figures 7, 8:
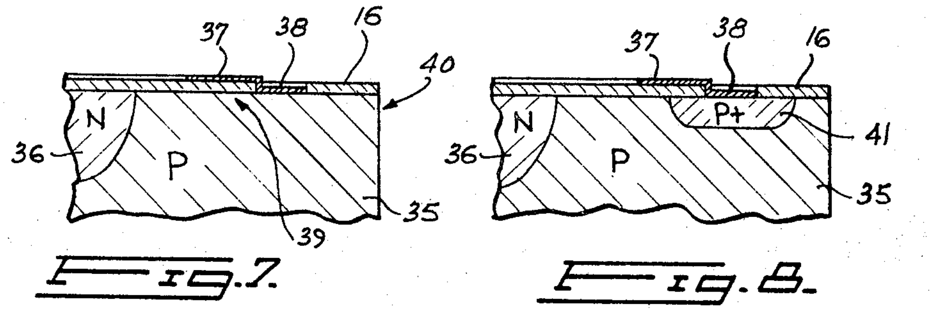
FIGURE 7 is a section through a diode showing guard shielding according to a further aspect of the invention.
FIGURE 8 shows the construction of FIGURE 7, combined with a guard ring of the type taught by the above-mentioned prior patent.

A further aspect of the invention is illustrated in FIGURE 7 which shows a diffused planar diode with background region 35 of either conductivity type, say P-type, and diffused region 36 of the opposite type. Oxide layer 16 is shown overlaid by an annular conducting guard shield 37 which is permanently electrically connected to region 35 by a tab 38 extending through an interruption in the oxide layer 16 at one location around the device. As has been explained above, the shield 37 being at the same potential as region 35 prevents the build up of an inversion layer at the surface 39 of region 35 and thus prevents channelling from the P-N junction along such a layer to the peripheral side surface 40 where damage to the crystal lattice would provide a conducting path to the body of the region 35 and constitute a conducting path across the junction. The danger of inversion channelling is greater when the background region 35 is P-type, but it nevertheless exists for N-type materials, and consequently this feature of the invention is also applicable to diodes in which the background region is N-type.

FIGURE 8 shows the guard shield 37 of FIGURE 7 combined with a guard ring 41 of heavily doped P-type material formed as an annulus in the region 35 and permanently electrically common with the tab 38. This construction combines the feature of the FIGURE 7 construction with those of the prior patent already referred to.

Figure 9:
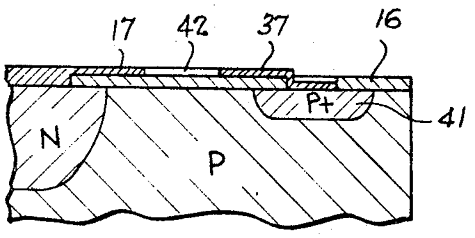
FIGURE 9 shows a diode incorporating shields constructed in accordance with the invention.

FIGURE 9 shows a planar diode incorporating the shield 17 with the guard shield 37, and also guard ring 41. Shields 17 and 37 are both annular and are radially spaced from each other by a gap 42 to avoid their short circuiting the junction.

Figure 10:
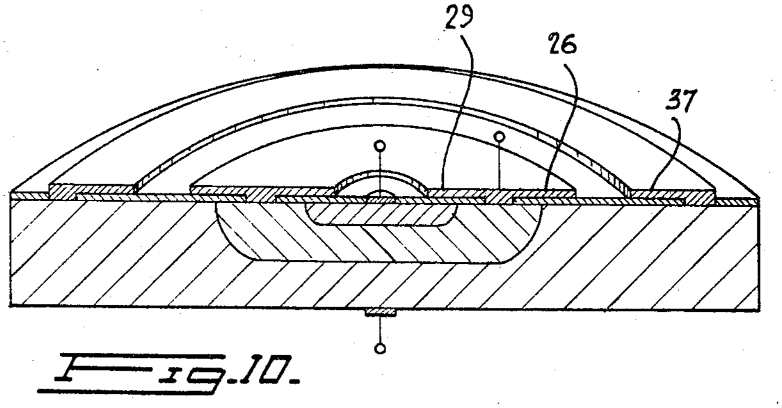
FIGURE 10 shows the features of FIGURE 8 applied to the transistor of FIGURE 5 by a sectioned perspective view.

FIGURE 10 shows a transistor incorporating simultaneously all the various features of the present invention described above, namely breakdown voltage shield 26, gain stabilizing shield 29 and guard shield 37. It is nevertheless to be understood that the invention includes within its scope the use of any one of such shields alone, or any combination of two of such shields simultaneously.

Figure 11:
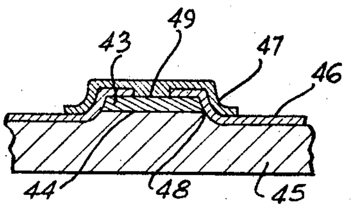
FIGURE 11 is a central section through an alternative embodiment.

FIGURE 11 shows a semiconductor device of the mesa type with a more heavily doped region 43 forming a junction 44 with a background region 45. The insulating layer in a mesa device is usually much thicker than the layer 46 shown in FIGURE 11, so as to be level with the top surface of the mesa region 43, but in the present construction the insulating layer 46 has been made relatively thin and of substantially uniform thickness. A thin insulating layer is necessary to achieve the purpose of the invention. Otherwise the shield 47, which has been provided to overlie the layer 46 and completely surround the junction edge 48 while being permanently connected to the region 43 at 49, would not lie sufficiently close to the active surface of the device to perform the necessary function of avoiding narrowing of the junction depletion layer at the junction edge 48. The manner in which the shield 47 performs this function and improves the breakdown voltage characteristics of the device is analogous to that already described in connection with the planar junctions and will not be repeated.

It is, however, desired to stress that the thickness of the insulating layer (and consequently the nearness of the shield 17, or 26, or 47 to the junction edge) must be small, if worthwhile improvements are to be realized. A thickness of the order of 1 micron is preferred, and any thickness above about 2 microns should be strictly avoided. While these values apply more fundamentally to the shields provided to improve the breakdown voltage characteristics, as a practical matter similar values will also normally apply to the spacing of the gain stabilizing and guard shields 39 and 37, since the problems that these shields avoid will only be serious in devices in which the insulating layer is thin (of the order of 1 to 2 microns) and since most modern semiconductor devices, especially the planar ones, will normally have thin insulating layers of this kind for other reasons.

Figure 12:
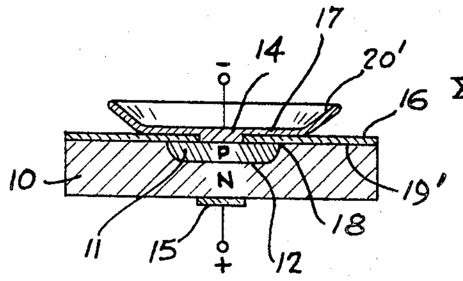
FIGURE 12 is a central section through a planar type diode showing a further form of the invention, the section being taken on the line XII—XII in FIGURE 13.
Figure 13:
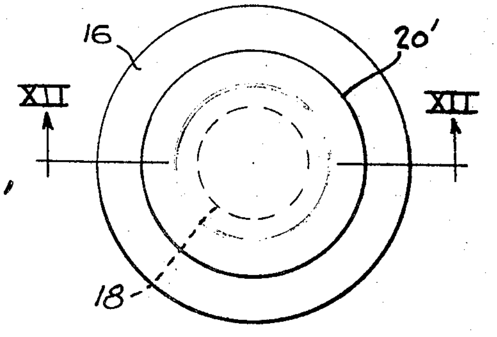
FIGURE 13 is a plan view of FIGURE 12.
Figures 14, 16:
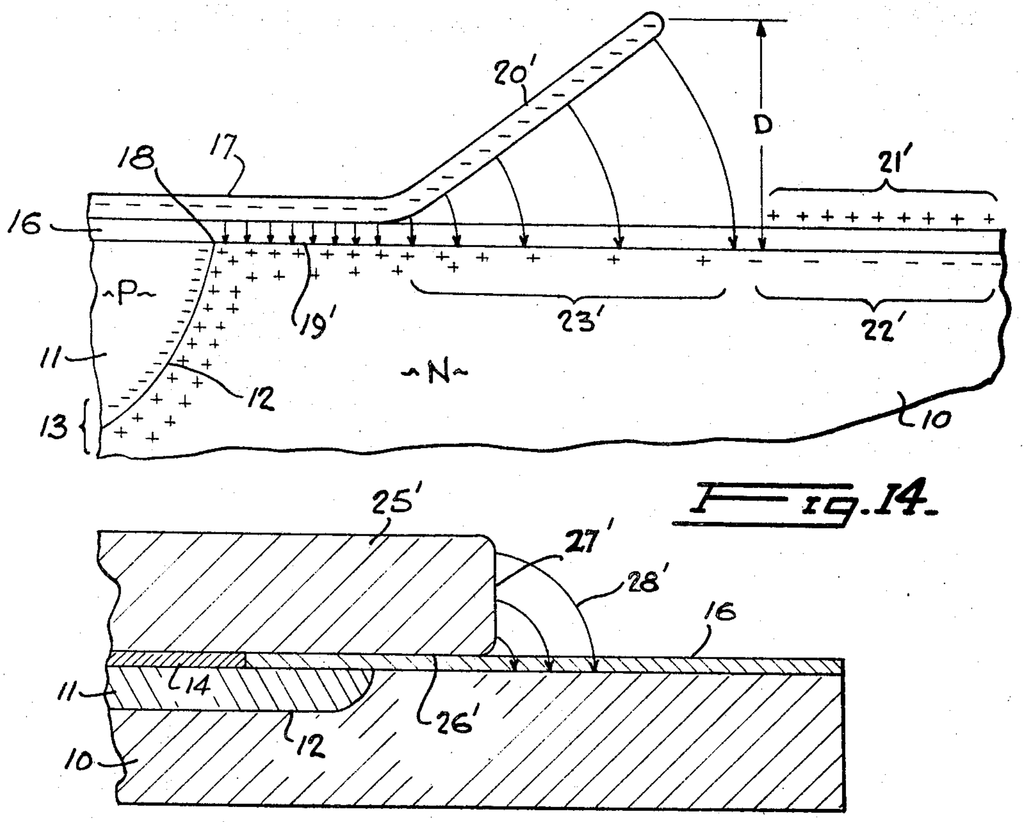
FIGURE 14 is a large scale fragment of FIGURE 12 demonstrating the believed electrical functioning thereof.
FIGURE 16 is a fragment of another similar device showing an alternative construction.

The diode seen in FIGURES 12 to 14 is a planar diffused diode having a background or undiffused region 10 of one conductivity type, say N-type. The diffused region 11 will then be of P-type. The device is circular in plan view and the P-N junction shown at 12 is planar.

The general area of the depletion layer shown at 13 (FIGURE 14) is the result of the application of the reverse bias voltages shown in FIGURE 1 to terminals 14 and 15, the conventional oxide layer 16 being interrupted for connection of terminal 14 to the diffused region 11. The terminal 14 has been extended as an annular shield 17 to overlie the edge 18 of the P-N junction 12.

In accordance with this form of the present improvement, the shield 17 has been further extended outwardly and upwardly to form an upturned collar 20′ which diverges from the free surface 19′ of the less heavily doped region 10. The resultant electrostatic field extending between the negatively charged overlying conductor (17, 20′) and the surface 19′ is shown by the arrows in FIGURE 14, the increased spacing between the arrows being intended to indicate how the divergence of the collar 20′ causes the intensity of such field to taper gradually away from a maximum value at the region immediately adjacent the junction depletion layer.

If there are extraneous positive charges on the insulating layer 16 beyond the influence of the collar 20′, namely in the region shown at 21′, they will tend to induce negative charges (an accumulation layer) 22′ at the surface of the region 10. On the other hand, the negatively charged collar 20′ will extend the induction of positive charges in the area 23′. It is theorized that the gradually diminishing nature of the field from the collar 20′ causes a corresponding gradual transition from the positive layer 23′ to the negative layer 22′, with no sharp change of polarity and consequently no area of high electrical stress. Experimental results have shown a significant increase in the breakdown voltage of diodes formed with an upturned collar 20′, in comparison with those fitted only with a shield 17, and this increase which has been especially marked in high voltage diodes has been ascribed to the absence of an area of comparatively sharp change of electrical polarity. For example, experimental diodes have been made with high resistivity silicon (60 ohm cm.); first with no shielding at all (exhibiting a breakdown voltage of typically 350 volts); then with the shield 17 alone, as in FIGURE 1, where breakdown voltages were observed up to 650 volts; and finally, with the shield 17 and the collar 20 (FIGURE 12), when breakdown voltages as high as 1300 volts were observed. It is to be understood that these figures are only provided as an indication of the general order of magnitude of the improvements observed, and they are not intended to represent a quantitative assessment of the merits of the present invention in its broad scope. The degree of improvement of breakdown voltage afforded by the invention will vary with other characteristics of the semiconductor device to which the inventive concept is applied.

Bearing in mind that the essence of the feature of the invention shown in the FIGURE 12 construction is the gradual tapering of the intensity of the fringe field of the shield in the direction extending radially away from the junction edge towards the less heavily doped side, it will be apparent that the degree of gradualness will necessarily remain a factor subject to some variation and choice. For example, a degree of gradualness of taper of the field that will be sufficient to increase the breakdown voltage in one device to approximately its theoretical maximum (at which breakdown occurs across the body of the junction rather than at its susceptible edge), may be insufficient and too abrupt for another device. This feature is thus incapable of rigid quantitative definition, and no meaningful lower or upper limit can be placed on the rate of taper that would be universally applicable to all semiconductor devices, and to all conditions and requirements for any given device. Without prejudice to the generality of the foregoing, it may nevertheless be stated that, typically, the distance D of the widest transverse divergence of the collar 20′ from the surface 19′, in order to provide a significant improvement in breakdown voltage, will be at least several times, and conveniently as much as ten times the thickness of the insulating layer 16, which latter determines the spacing of the shield 17 from the surface 19′. Thus, if the layer 16 were one micron thick, the distance D would normally be at least three microns and preferably more, say ten microns.

Figure 15:
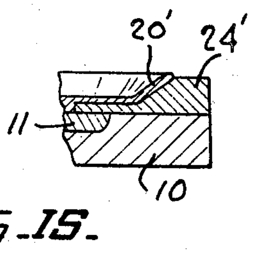
FIGURE 15 is a fragment of FIGURE 12 showing a modification.

Many structural arrangements will be possible. Should the collar 20′ require structural support this may be provided by filling in the gap with further insulating material 24′, as shown in FIGURE 15. If desirable for constructional reasons the dielectric 24′ may be formed stepwise.

FIGURE 16 shows a further alternative in which a relatively thick conducting member 25′ is superposed on and connected to the terminal 14, the under surface 26′ of the member 25′ acting as the shield and the end surface 27′ of the member 25′ forming the tapering fringe field 28′. Another variant is shown in FIGURE 17 where shield 17 is retained and a relatively thick conducting member 29′ is superposed on it, the member 29′ having a curved or otherwise inclined surface 30′ forming a tapering fringe field 31′.

The invention can conveniently employ the nail head bond type of terminal connection in which a ball of gold on the end of a gold wire is squashed down onto a surface for the purpose of making contact therewith. This type of construction, adapted to the requirements of the present invention, is shown in FIGURE 18 which illustrates a gold wire 32′ terminating in a gold bond 33′ which has the typical flattened, annular shape of a squashed ball. Around its perimeter the conducting bond 33′ has a surface 34′ closely overlying the insulating layer 35′ in the area immediately radially inward and outward of the junction edge 36′ and, outwardly of the surface 34′, a second surface 37′ that curves away from the surface 38′ of the less heavily doped region 39′ of the diode to form the fringe electrostatic field of tapering intensity that is the essential feature of this aspect of the present invention.

As above indicated, although the invention is especially suited to use with planar junctions, it can be employed with other junctions, and FIGURE 19 provides an illustration of its application to a mesa type device having a more heavily doped region 40′ forming a junction 41′ with a background region 42′. The insulating layer in the area 43′ has been made thin in order that the shield 44′ which is connected to the region 40′ at 45′ should overlie the junction edge 46′ sufficiently closely to perform its function of avoiding narrowing of the junction depletion layer in the region of the junction edge 46′. Radially outwardly of this region, the shield 44′ is formed with an upturned collar 47′ which provides a tapering fringe field analogously with that formed by the collar 20′.

While the principal advantages of this aspect of the present invention are expected to be found in its application to diodes, its applicability is not thus restricted. It will, in fact, be applicable to any semiconductor device having a junction the breakdown voltage of which can be usefully increased. An application of this aspect of the invention to a planar type transistor is shown in FIGURE 20, the base collector junction 48′ of which is protected by a shield 49′ formed with an upturned collar 50′.

Since the essential feature of this aspect of the present invention is the provision of a fringing field of tapering intensity, it is possible for this effect to be produced by methods other than physical divergence of the semiconductor surface and an equipotential conductor. The same field effect can be produced by a conductor of outwardly decreasing potential, or by use of a dielectric of tapering dielectric constant. Since these latter procedures will tend to introduce structural complications, they are generally less preferred than the structurally simple physical tapering of an upturned collar or one of the mechanical equivalents thereof, but nevertheless such alternatives are within the broad scope of the invention and may find practical application in some special device.

We claim:

1. A semiconductor device of the planar diffused diode type comprising (a) a background region of a first conductivity type material with a second conductivity type region diffused therein, (b) said regions defining a planar junction including a junction edge defined by the line of intersection of said junction with a free surface of the device, said junction surrounding said second region, (c) an insulating layer covering said surface at least in the vicinity of said edge, (d) a shield of electrically conducting material including means permanently electrically connecting said shield to said diffused region, (e) said shield being superposed on said insulating layer to extend parallel to said free surface and project outwardly beyond said edge over said background material, along the entire extent of said edge, (f) and conducting means connected to said shield and extending outwardly thereof over said background material along the entire extent of said shield, said conducting means comprising an annular flange having an upturned bottom surface diverging upwardly and radially away from said shield so that the separation between said conducting means and said background material increases with increasing distance from said shield for forming a fringe electrostatic field extending from said conducting means to said background material, said field being of gradusually tapering intensity in the outward direction.

2. A semiconductor device according to claim 1, wherein said conducting means extends away from said background material to a transverse distance at least several times greater than the thickness of said insulating layer.

3. A semiconductor device according to claim 2, wherein said conducting means extends away from said background material to a transverse distance at least approximately ten times greater than the thickness of said insulating layer.

4. A semiconductor device comprising
(a) a P region and an N region together defining a PN junction having a junction edge constituted by the line of intersection of said junction with a free surface of the device,
(b) an insulating layer covering said surface,
(c) a shield of electrically conducting material includink means electrically connecting said shield to one of said regions,
(d) said shield being superposed on said insulating layer to extend parallel to said free surface and project beyond said edge over the other of said regions along the entire extent of said edge,
(e) and conducting means connected to be of the same electrical potential as said shield, said conducting means extending beyond said shield over said other region,
(f) wherein said conducting means comprises an annular flange having an upturned bottom surface diverging upwardly and radially away from said shield so that the separation between said conducting means and said other region increases with increasing distance from said shield and becomes at least several times greater than the distance beween said shield and said other region said conducting means thereby forming a fringe electrostatic field extending from itself to said other region, said field being of gradually and substantially smoothly diminishing intensity in the direction away from said shield.

5. A semiconductor device according to claim 4, wherein said conducting means extends away from said other region to a transverse distance at least approximately ten times greater than the distance between said shield and said other region.

6. A semiconductor device according to claim 5, wherein said insulating layer is no greater than approximately two microns in thickness, and said conducting means extends way from said other region to a transverse distance of at least approximately twenty microns.

7. A semiconducor device according to claim 4, wherein said junction is a planar junction.

8. A semiconductor device according to claim 4, wherein said other region is less heavily doped than said one region and the material of said less heavily doped region is high resistivity semiconductor material whereby to cause said junction to have a theoretically high breakdown voltage.

9. A semiconductor device according to claim 8, wherein the material of said less heavily doped region is N type material.

10. A semiconductor device according to claim 4, wherein said conducting means comprises a upstanding collar formed as a continuation of said shield.

11. A semiconductor device according to claim 8, wherein said shield and said conducting means are together constituted by a conducting member thick in relation to said insulating layer, said conducting member being permanently electrically connected to said one region and having a first surface closely overlying said other region to constitute said shield and a second surface diverging from said other region to form said annular flange for providing said fringe field.

References Cited

UNITED STATES PATENTS

| | | | |
|---|---|---|---|
| 2,756,285 | 7/1956 | Shockley | 317—234 X |
| 2,928,162 | 3/1960 | Marinace | 29—25.3 |
| 2,981,877 | 4/1961 | Noyce | 317—235 |
| 3,040,266 | 6/1962 | Forman | 317—235 X |
| 3,097,308 | 7/1963 | Wallmark | 307—88.5 |
| 3,197,681 | 7/1965 | Broussard | 317—235 |
| 3,206,827 | 9/1965 | Kriegsman | 29—25.3 |
| 3,237,271 | 3/1966 | Arnold et al. | 29—25.3 |
| 3,271,201 | 9/1966 | Pomerantz | 148—32.3 |
| 3,280,391 | 10/1966 | Bittman et al. | 317—234 |
| 3,238,425 | 3/1966 | Geyer | 317—234 |
| 3,300,841 | 1/1967 | Fisher et al. | 317—234 X |
| 3,302,076 | 1/1967 | Kang et al. | 317—234 |

FOREIGN PATENTS

| | | |
|---|---|---|
| 954,534 | 4/1964 | Great Britain. |
| 998,388 | 7/1965 | Great Britain. |

JOHN W. HUCKERT, *Primary Examiner.*

R. SANDLER, *Assistant Examiner.*